US007893346B2

United States Patent
Nachamkin et al.

(10) Patent No.: US 7,893,346 B2
(45) Date of Patent: Feb. 22, 2011

(54) INTEGRATED VOLTAIC ENERGY SYSTEM

(76) Inventors: Jack Nachamkin, 51 Broomall La., Glen Mills, PA (US) 19342; Gary T. Sheehan, 5 Mesa La., Malvern, PA (US) 19355

(*) Notice: Subject to any disclaimer, the term of this patent is extended or adjusted under 35 U.S.C. 154(b) by 729 days.

(21) Appl. No.: 11/862,309

(22) Filed: Sep. 27, 2007

(65) Prior Publication Data

US 2008/0078436 A1 Apr. 3, 2008

Related U.S. Application Data

(60) Provisional application No. 60/847,878, filed on Sep. 28, 2006.

(51) Int. Cl.
*H01L 31/042* (2006.01)
*H02J 9/00* (2006.01)
*H02M 7/48* (2007.01)

(52) U.S. Cl. ........................ 136/244; 136/293; 307/64; 307/52; 307/18; 363/71

(58) Field of Classification Search ................ 136/244, 136/293; 307/64, 52, 18; 363/71
See application file for complete search history.

(56) References Cited

U.S. PATENT DOCUMENTS 3,944,837 A 3/1976 Meyers et al.
3,946,242 A 3/1976 Wilkerson
4,182,960 A 1/1980 Reuyl
4,510,549 A * 4/1985 Tedesco ........................ 361/86
4,797,566 A 1/1989 Nozaki et al.
5,844,327 A * 12/1998 Batson ........................ 307/64
6,175,512 B1 * 1/2001 Hagihara et al. .............. 363/71
6,363,928 B1 * 4/2002 Anderson, Jr. .............. 126/577
6,838,611 B2 * 1/2005 Kondo et al. ................ 136/244
2004/0066094 A1 * 4/2004 Suzuki et al. ................. 307/18
2005/0281064 A1 * 12/2005 Olsen et al. ................... 363/71

OTHER PUBLICATIONS

California Energy Commission, Renewable Energy Program, Buying a Photovoltaic Solar Electric System, A Consumer Guide, 2003 Edition; front cover, pp. i-vi and 1-22.

www.bigfrogmountain.com/research.htm, Photovoltaic Solar Electric Systems, How They Work; pp. 1-5.

(Continued)

*Primary Examiner*—Jeffrey T Barton
*Assistant Examiner*—Devina Pillay
(74) *Attorney, Agent, or Firm*—Paul & Paul

(57) ABSTRACT

An integrated voltaic energy system incorporates a bio-friendly DC power generator with a photovoltaic (PV) system connected to feed a main service panel and a utility grid. A plurality of inverters are connected one each, to a respective output of one of a plurality of photovoltaic (PV) solar arrays. The outputs of each of the inverters are connected to a main service panel and a utility grid. A further inverter is connected to the DC power generator and in parallel with the other inverters. The DC power generator is also connected to each of the PV solar panel inverters through a switch operated at a specific time manually or automatically. When switched the DC power generator feeds all of the inverters. A resistor/capacitor structure is connected between the DC power generator and each inverter. A self-powered timer may control the output level of the DC power generator.

16 Claims, 1 Drawing Sheet

OTHER PUBLICATIONS www1.eere.energy.gov/solar/photovoltaics.html, Solar Energy Technologies Program: Photovoltaics; pp. 1-2.

www1.eere.energy.gov/solar/pv__basics.html, Solar Energy Technologies Program: Photovoltaic Basics; pp. 1-4.

http://en.wikipedia.org/wiki/Photovoltaics, Photovoltaics; pp. 1-15.

California Energy Commission, Renewable Energy Program, Buying a Photovoltaic Solar Electric System, A Consumer Guide, 2003 Edition; front cover, pp. i-vi and 1-22, 2003 Edition, published Mar. 2003. (USA).

www.bigfrogmountain.com/research.htm, Photovoltaic Solar Electric System, How They Work; pp. 1-5, print date Sep. 18, 2007, published at least as early as Feb. 18, 2003. (USA).

www1.eere.energy.gov/solar.photovoltaics.html, Solar Energy Technologies Program: Photovoltaics; pp. 1-2, print date Sep. 18, 2007, published at least as early as Jun. 18, 2005. (USA).

www1.eere.energy.gov/solar/pv__basics.html, Solar Energy Technologies Program: Photvoltaic Basics; pp. 1-4, print date Sep. 18, 2007, published at least as early as Nov. 7, 2006. (USA).

http://en.wikipedia.org/wiki/Photovoltaics, Photovoltaics; pp. 1-5, print date Sep. 18, 2007, published at least as early as Sep. 18, 2007. (USA).

* cited by examiner

INTEGRATED VOLTAIC ENERGY SYSTEM

This application claims priority to U.S. application Ser. No. 60/847,878, filed Sep. 28, 2006, of which the disclosure is incorporated by reference herein in its entirety.

BACKGROUND OF THE INVENTION

Solar photovoltaic electricity systems are becoming more popular. These systems allow homeowners, farmers, business owners and non-profits to generate some or all of their own electricity on-site, while still conveniently connected with the electric utility grid. Solar equipment is expensive and includes solar modules and inverters.

Solar PV infrastructure includes solar PV modules and inverters. The modules use silicon cells that create direct current (DC) when exposed to sunlight (photons). Direct current (DC) is delivered to solar inverters, which invert the DC power to grid-quality AC power. The AC output is fed into a main service panel or sub panel, and can also feed back to the utility grid. The energy can be used directly by loads served by the panel, and excess electricity can flow out onto the utility grid and turn the meter "backwards".

Photovoltaic (PV) solar panels are a source of DC electrical energy when the level of light intensity (irradiance) falling on them is sufficient. This DC energy cannot be utilized by the utility grid until it is converted into a reasonable facsimile of a 60 Hz sinusoidal wave, which will be referred to as "60 Hz AC", or simply "AC". The "machine" that accomplishes this will be referred to as an "inverter". A solar PV installation can consist of multiple PV arrays connected in various series and parallel modes to multiple inverters. When more than a single inverter is employed, the inverters interact only at the 60 Hz AC outputs. The DC inputs to each inverter are independent from the inputs to other inverters. Paralleling dissimilar DC inputs into the same inverter can lower output efficiency. This is because an algorithm within each inverter is employed to calculate and track the optimal contribution of that inverter to the total AC energy output. The energy is delivered to the service panel and potentially to the utility grid. The utility grid is often referred to as "the grid". Generally the grid can absorb all the AC that is fed to it by the inverters.

When solar irradiance is sufficiently low, the DC voltage provided by the PV solar panels drops below operating levels. As a result, the AC output of the inverters goes to zero and they are programmed to turn themselves off. This certainly occurs at night, but can also occur on very overcast days, as well as days where the PV solar panels are covered with snow, leaves, shadows, etc.

SUMMARY OF THE INVENTION

The motivation for the present invention is to:

Optimize the use of solar photovoltaic inverters during downtime, such as periods when solar irradiance is low, such as evenings, days of heavy cloud cover and days of snow cover, and to use low-cost and increasingly abundant power sources, such as diesels and biofuel diesel fuel substitutes, for on-site electricity generation, either in parallel with the utility (grid-tied) or as a stand-alone generation system (off-grid).

The present integrated voltaic energy system makes more extensive use of the solar PV energy inverters. The system will be run with relatively cheap and abundant bio-diesel fuels or vegetable oil and cooking grease by-products to power a generator to generate DC power which is delivered to a series of solar inverters, which in turn will invert DC to grid quality AC. The system can also run in parallel with other environmentally-friendly energy sources such as wind power, micro-hydro power and fuel cells. This joining of solar, bio-fuels and other renewable technologies, will improve the cost-effectiveness of each type of system, making renewable energy even more attractive to potential customers.

There are many advantages to developing the distributed generation of the present invention, including supporting peak loads during times of heavy electricity usage and grid congestion. Biofuels will be processed to be compatible with the engine system employed in the energy system of the present invention, which converts the fuel to electrical energy.

BRIEF DESCRIPTION OF THE DRAWINGS

The features, advantages and operation of the present invention will become readily apparent and further understood from a reading of the following detailed description with the accompanying drawings, in which like numerals refer to like elements, and in which.

DETAILED DESCRIPTION OF THE INVENTION

Figure 1:
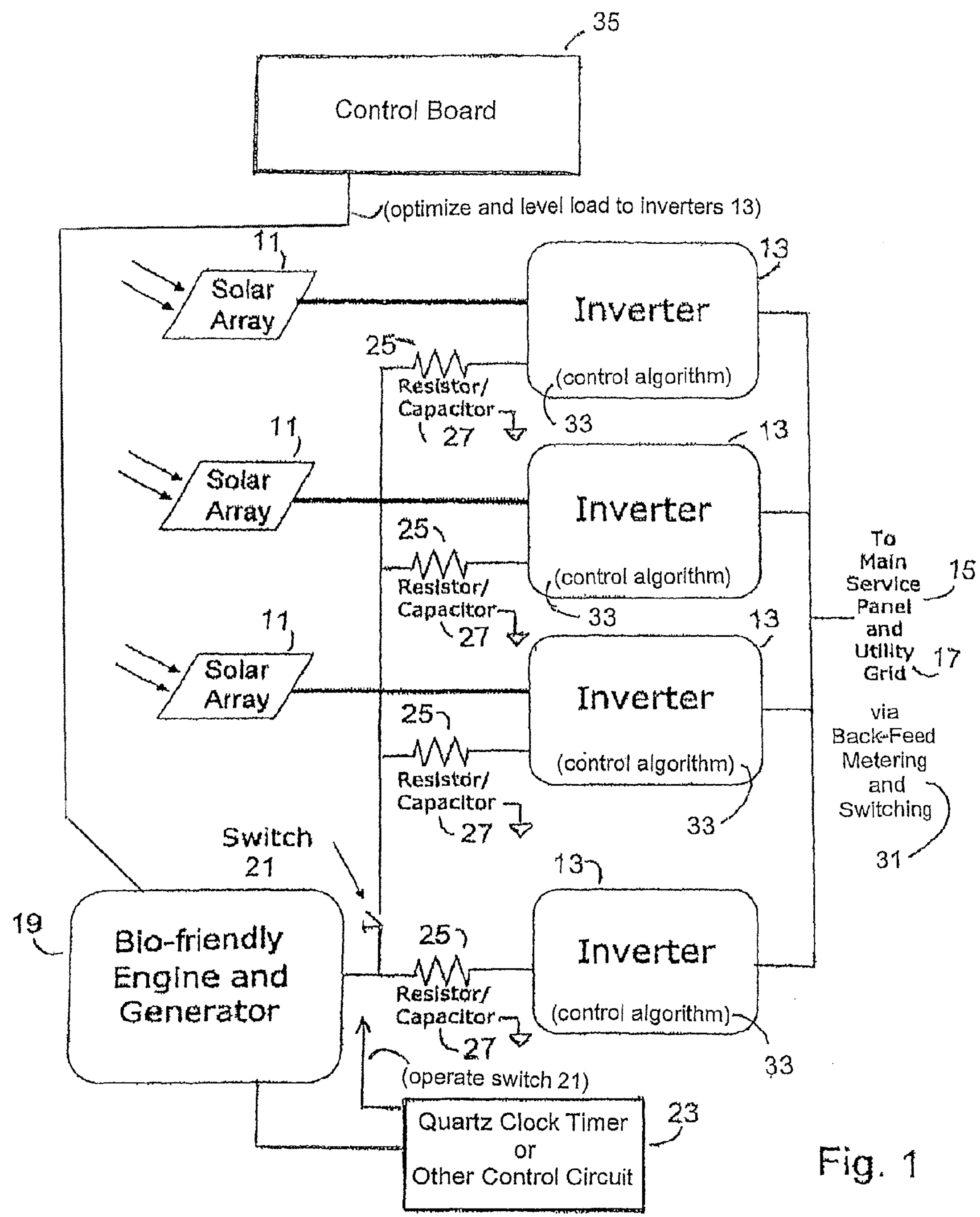
FIG. 1 is a block diagram of the electrical components and fuel driven generation unit with electrical interconnections.

An integrated voltaic energy system utilizes a bank of a plurality of photovoltaic (PV) solar panels 11, FIG. 1, operating in parallel, as a source of DC electrical energy when the level of light intensity (irradiance) falling on them is sufficient. The output of each respective PV solar panel is normally fed to a respective one of a bank of inverters 13, also connected in parallel to an output. The output from the bank of inverters 13 is connected to the main service panel 15 of the local facility and to the utility grid 17, using standard back-feed metering and switching 31.

An engine and generator unit 19, provides sufficient power to be a substitute for the total aggregate power supplied by the bank of individual PV solar panels 11, when the panels 11 are inoperative. The engine and generator unit 19 is throttled back to produce the power equivalent to an individual PV solar panel 11 when the solar panels 11 are producing. During this time the engine-generator 19 is connected to only a respective one of the inverters 13, which inverter output 13 is connected in parallel with the outputs of the other inverters 13 to the main service panel 15 and utility grid 17.

This permits the algorithm 33 which controls the circuitry within each inverter 13 to remain unchanged as the system switches from solar power to engine-generator power and back. When solar irradiance is sufficiently low, the DC voltage of each PC solar panel drops below operating levels, and the AC output of the inverters would normally go to zero. However, as the engine-generator 19 output is increased, and fed to each of the inverters 13, the inverters 13 will be operating and the main service panel 15 and utility grid 17 see no difference in power from the system.

The certainty of zero PV output at night allows a strategy of using the inverters 13 to supply the grid with an environmentally-friendly power source during the nighttime. The present integrated energy system is available to deliver DC input to the inverter 13 bank virtually all the time. The system employs the engine-generator 19 as an environmentally friendly power source such as a fuel cell, windmill, a micro-hydro generator, or a diesel engine running on the least expensive fuels available, or a combination thereof, driving a DC generator or generators that will closely match the solar DC voltage and amperage output of PV solar panels 11. Preferably, the power source 19 is a generator powered by a diesel engine using relatively cheap and abundant bio-diesel or vegetable oil fuel to generate DC power and deliver it to the solar inverters, which in turn will invert DC to grid quality AC. The system will also be available to operate as another supplemental power source during the day, when the PV solar panels 11 are delivering sufficient power and the inverters are fully operational.

Separate diesel/DC generator units 19 can be installed that may run continuously or intermittently. During the day, the power unit 19 or plural power units 19 will feed their respective own dedicated inverter(s) 13 which are separate from the inverters connected to the PV solar panels 11. The output of the engine-generator unit(s) 19 is/are reduced during the day to match the input values of a respective dedicated inverter 13. At night, however, the DC output of the unit(s) 19 can be maximized and will be directed into the inputs of all the inverters 13. In the latter nighttime situation, the inverter 13 inputs would all be connected in parallel to the engine-generator unit(s) 19 DC output(s), by activating a switch 21 either manually or automatically. Thereby, a single DC unit output 19 will be available to all its associated bank of parallel connected inverters 13.

In addition, the engine-generator unit 19 can also be operated directly using the bank of inverters 13; without the PV solar panels 11 having been installed at the site.

A quartz timer 23 or other control device may be used to operate the switch 21

In the nighttime connection, with a single DC output from the engine-generator unit 19S the inverters 13 may be able to "communicate" with each other via their common connection to the unit 19. This creates the possibility of instabilities due to feedback, which would be determined by the algorithm that optimizes the output of each inverter 13. This situation is similar to electrical power amplifiers where the active elements are driven by a common signal as a source and the active elements also draw power from the source.

One solution to the feedback problem is to decouple the active elements with a resistor 25 in series with each active-element (inverter 13) input. Assuming the internal resistance of each of the active elements, i.e., each inverter 13, to be zero, the series resistor might be adjusted to not only damp out feedback oscillations, but also limit the power to each of the inverters 13.

FIG. 1 shows four inverters 13, and a series resistor 25 in the line with the input to each inverter 13. The value of this resistor 25 can be chosen to be four times the internal resistance of the power unit 19 delivering the DC power. The overall resistance of all the inverters 13, when the load is balanced, will be equal to the maximum output of the power unit 19, in the case of a total short circuit of the inverters 13. The algorithm governing the optimum output of the inverters 13 will have to be taken into account to determine the optimal size of the decoupling resistors 25, which by the nature of the element use power.

In the alternative, an active solid-state control board 35 can be utilized to optimize and level the load to the multiple inverters 13 fed by a DC power unit 19.

A DC power unit 19, such as an engine-generator, that energizes a bank of inverters 13, FIG. 1, does not have to be in the same enclosure that houses the inverters 13. The equipment is designed and built in accordance with machine safety standards, including the National Standards Institute (ANSI), National Fire Protection Association (NFPA), Robotics Industries Association (RIA), and U.S. Occupational Safety & Health Administration (OSHA), among others. Components of the system will be UL listed, and listings will be developed where required. The housing should be sufficient to prevent variations in climate affecting the operation of the power units 19. All dangerous parts of the units, such as rotating sprockets, pulleys, chains, and/or belts will have to comply with applicable rules and regulations such as OSHA and other related safety rules. Electrical potentials (voltages) must be insulated to a reasonable degree against accidental shocks and inadvertent short circuits that may occur during normal maintenance and even casual inspection. All parts of the unit must be sufficiently clear of obstructions to allow maintenance, repair, and replacement of defective parts Reasonable reduction of noise, fumes and exhausts must be done in accordance with applicable rules and regulations. Maintenance and inspection must be accomplished in the proximity of the DC units while they are running, with no possibility of inhaling fumes generated by the DC units. Periodic inspection and preventive maintenance schedules must be established before installing DC units. Contact information for help should be posted prominently in proximity of the units. Fire control for fuel and electrical fires, such as extinguishers, sand, etc, should be easily available next to power units.

Switching between daytime and nighttime operation can alternatively be automated. However, this switch over is a critical operation that cannot depend upon being powered by the utility grid. The timer 23 therefore has an independent battery power, and timing switches controlled by independently powered quartz-crystal clocks. The logistics for setting the clocks, charging the batteries, and choosing appropriate switches can be determined as needed.

As an override, an operator can control the switchover from daytime to nighttime and vice-versa by using the manual switch 21. A timed alarm can sound to remind an operator that the time for a switchover has arrived.

The DC unit 19 output must be well-matched to the inverter 13, allowing the DC unit diesel engine 19, if the power unit is so implemented, to operate at a constant speed. The DC power unit 19 is of low enough power capability so as not to overload its respective single associated inverter 13. Most commercial inverters 13 have the capability to limit power input to avoid excessive heat sink temperatures.

Care must also be taken in the construction such that the sudden application of DC voltage by closing or opening a switch does not generate a voltage spike that could endanger the inverter electronics. A sufficiently large capacitor or capacitors 27 shunted to ground with a sufficiently large "bleeder" resistor 37 or resistors 37 will dampen any initial spike and allow capacitors 27 to discharge during daytime operation. These capacitors 27 will also act as lightning suppressors.

In the system shown in FIG. 1, four inverters 13, are each capable of handling 3200 watts DC input and 2500 watts AC output. The system is associated with a PV solar panel system consisting of three independent sets of PV solar panels 11. Each independent set of PV solar panels 11 is uniquely assigned to one of the four inverters 13. The fourth inverter 13 is assigned to a DC bio-fuels unit 19 or other bio-friendly generator/engine-generator unit. The DC unit 19 is operating continuously.

During nighttime operation, the DC unit 19 is powering all the inverters 13, in the manner described above. At daybreak, as each PV solar panel 11 voltage begins to rise to the plural inverters' 13 operable voltage window, an alarm alerts a user to switch over to daytime operation. During daytime operation the PV solar panels 11 supply energy respective to their associated inverter 13 of the inverter bank while the DC unit 19 output is reduced to supply power only to the fourth inverter 13. At dusk, the alarm sounds again for the operator to switch back to nighttime operation.

At least once a week the operator will inspect the DC unit 19. Oil changes and preventative maintenance will be done in compliance with the manufacturer's specifications for the diesel engine if one is employed.

Many changes can be made in the above-described invention without departing from the intent and scope thereof. It is therefore intended that the above description be read in the illustrative sense and not in the limiting sense. Substitutions and changes can be made while still being within the scope and intent of the invention and of the appended claims.

The invention claimed is:

1. An integrated photovoltaic (PV) system, comprising:

a plurality of identical DC output PV solar panels;

a plurality of identical power rated and programmed PV inverters operating in parallel and being connected in parallel on their respective outputs, and connected one each exclusively on its input to a respective one of said plurality of said PV solar panels;

a bio-friendly DC power unit;

a control circuit connected to said bio-friendly DC power unit; and a further inverter of identical power rating to said plurality of said PV inverters and programmed as said plurality of said PV inverters, connected on its input to the output of said DC power unit and connected on its output in parallel to said plurality of inverters parallel output connection;

wherein said control circuit is programmed to control said bio-friendly DC power unit to supply the same power to said further inverter as each of said plurality of said PV solar panels supplies to said plurality of said PV inverters, when said plurality of said PV solar panels are outputting power;

wherein said control circuit is programmed to selectively connect said DC power unit in parallel to the input of each of said plurality of said PV inverters and to said further inverter when said plurality of parallel operating PV solar panels are not operative, wherein said DC power unit is controlled to supply substitute power to said plurality of said PV inverters; and wherein said parallel output connection of said plurality of said PV inverters and said further inverter is connected to an electric system.

2. The system of claim 1, wherein said DC power unit includes a diesel fuel powered generator.

3. The system of claim 2, wherein said diesel fuel powered generator includes a biofuel powered generator run by biodiesel fuel or vegetable oil fuel.

4. The system of claim 1, wherein said DC power unit includes a wind electric power generator.

5. The system of claim 1, wherein said DC power unit includes a hydro electric power generator.

6. The system of claim 1, wherein said DC power unit includes a fuel cell power generator.

7. The system of claim 1 wherein said bio-friendly DC power unit includes a controller programmed to establish a power level equal to the aggregate sum of the power levels of said plurality of identical plural PV solar panels when said PV solar panels are not outputting power.

8. The system of claim 7, wherein said DC power unit output is controlled by a self-powered timer.

9. The system of claim 1, further comprising:

a switch separating said bio-friendly DC power unit output from said parallel circuit connection to said plurality of said PV inverters;

wherein said control circuit operates said switch to selectively connect the bio-friendly DC power unit output to said parallel circuit connection and to interrupt said connection; and wherein said parallel connection to said plurality of said PV inverters includes a decoupler on the input to each said PV inverter, and a decoupler on the input to said further inverter.

10. The system of claim 9, wherein said switch is a manually operated switch.

11. The system of claim 9, wherein said switch is an automatically operated switch responsive to a self-powered timer.

12. The system of claim 9, wherein each decoupler includes a load resistor in series on the input to each of said plurality of said PV inverters and to the input to said further inverter, and wherein said control circuit is a clock timer.

13. The system of claim 12, also including an active solid state control board, said control board being connected to optimize and level the loads to each of said PV inverters.

14. The system of claim 13, wherein said bio-friendly DC power unit has an internal resistance which is one-fourth of the resistance value of said load resistors.

15. The system of claim 14, also including an individual capacitor shunt to ground on each respective input to each said one of said plurality of said PV inverters and on the input to said further inverter.

16. The system of claim 15, wherein said connection of said plurality of said PV inverters and further inverter to said electric system includes a connection to a local facility main service panel and a connection to a power utility grid, and wherein said connection to said local facility main service panel and a power utility grid is by back-feed metering and switching.

* * * * *

UNITED STATES PATENT AND TRADEMARK OFFICE

CERTIFICATE OF CORRECTION

PATENT NO. : 7,893,346 B2
APPLICATION NO. : 11/862309
DATED : February 22, 2011
INVENTOR(S) : Jack Nachamkin and Gary T. Sheehan It is certified that error appears in the above-identified patent and that said Letters Patent is hereby corrected as shown below:

Column 3, line 28, reads "the engine-generator unit 19S the inverters 13 may be able to"
should read -- the engine-generator unit 19 the inverters 13 may be able to --

Column 4, line 51, reads "capable of handling 3200 watts DC input and 2500 watts AC"
should read -- capable of handling 3200 watts DC input and 2500 watts AC --

[Remove bold from "3200" ]

Signed and Sealed this
Fifth Day of April, 2011

David J. Kappos
*Director of the United States Patent and Trademark Office*